United States Patent [19]

Meakin et al.

[11] 4,328,390

[45] May 4, 1982

[54] THIN FILM PHOTOVOLTAIC CELL

[75] Inventors: John D. Meakin; Julio Bragagnolo, both of Newark, Del.

[73] Assignee: The University of Delaware, Newark, Del.

[21] Appl. No.: 185,322

[22] Filed: Sep. 8, 1980

Related U.S. Application Data

[63] Continuation-in-part of Ser. No. 76,238, Sep. 17, 1979, abandoned.

[51] Int. Cl.³ .......................................... H01L 31/06
[52] U.S. Cl. ................................... 136/259; 136/256; 136/260; 357/30; 357/52; 357/68
[58] Field of Search ...................... 136/259, 260, 256; 357/30, 52, 68

[56] References Cited

U.S. PATENT DOCUMENTS

| | | | |
|---|---|---|---|
| 3,487,223 | 12/1969 | St. John | 250/216 |
| 4,053,326 | 10/1977 | Forrat | 136/256 |
| 4,166,880 | 9/1979 | Loferski et al. | 428/457 |

OTHER PUBLICATIONS

J. A. Bragagnolo, "Photon Loss Analysis of Thin Film CdS/Cu₂S Photovoltaic Device", *Conf. Record, 13th IEEE Photovoltaic Specialists Conf.* (1978), pp. 412-416.

*Primary Examiner*—Aaron Weisstuch
*Attorney, Agent, or Firm*—Connolly and Hutz

[57] ABSTRACT

A thin film photovoltaic cell having a transparent electrical contact and an opaque electrical contact with a pair of semiconductors therebetween includes utilizing one of the electrical contacts as a substrate and wherein the inner surface thereof is modified by microroughening while being macro-planar.

5 Claims, 3 Drawing Figures

4,328,390

THIN FILM PHOTOVOLTAIC CELL

The U.S. Government has an interest in this invention pursuant to Subcontract No. XR-9-8063-1 awarded by the Solar Energy Research Institute under U.S. Department of Energy Contract No. EG-77-C-01-4042.

CROSS-REFERENCE TO RELATED APPLICATION

This application is a continuation-in-part of application of Ser. No. 76,238, filed Sept. 17, 1979, now abandoned.

BACKGROUND OF INVENTION

The performance of thin film solar cells depends on the absorption of incident light. In general, one may expect that reflection from the outermost surface of the cell limits the amount of incident solar energy entering the cell. A further consideration is that the absorbing semiconductor layers are too thin to absorb all of the usable solar energy in one optical pass. This is a consequence of limited minority carrier diffusion length in thin film semiconductor absorber materials. In the specific case of front-wall $CdS/Cu_2S$ cells, for example, which are built-up sequentially by the deposition of CdS and $Cu_2S$ on a zinc plated copper substrate, the substrate has been found to have an influence of up to 25% on the efficiency of the cells. Experience with the $CdS/Cu_2S$ cell and a general theoretical analysis have shown that the substrate must have high reflectivity in the spectral region about 500 nm. In addition, the substrate should be a diffuse reflector in a specific way. The diffuseness should be such that normally incident radiation is reflected at such an angle that on re-entering the absorbing semiconductor layer, the light is interally reflected and trapped within the cell.

Two other techniques are well known for achieving high absorption of incident light in solar cells. The first is to use antireflection layers in order to reduce reflection of incident light from the outermost surface of the cell. The second technique, set forth by A. B. Tanos in U.S. Pat. No. 3,480,473, is to roughen the front surface of the cell by etching so that incident light undergoes multiple reflections. Present high efficiency thin film $CdS/Cu_2S$ solar cells described in the IEEE Transactions on Electron Devices, Vol. ED-27, No. 4, pages 645-51, April, 1980, used a single layer silicon oxide antireflection coating, and etched CdS to form the cell built on a reflecting substrate. The substrate was formed by electroplating a thin layer of zinc onto the matte side of electroformed copper foil of the type used, for example, in the printed circuit board manufacture art. As a result of the electroforming process, the matte side of the copper foil is characterized by pyramidal protuberances which are, on the average, three microns high from their base to their peak and are spaced eleven microns apart over the entire surface. This roughness produces the desired diffuse reflections. High reflectivity is obtained as a result of reaction between the zinc layer and the underlying copper to form brass, which has substantially higher reflectivity than zinc.

However, it is also known to the art that increased area of the $CdS/Cu_2S$ heterojunction reduced the achievable open circuit voltage. The increased area is the result of roughness of the substrate and etching described above.

Roughened surfaces can also diminish the efficiency of solar cells having grid lines for transparent contacts. The electrical path length of a grid line traversing a roughened surface is greater than across a smooth surface, causing resistive power losses. In the prior art pertaining to roughened cells, thicker grid lines were employed to compensate for increased length. Since many thin film solar cells use noble metals for the transparent contact, this approach is economically disadvantageous.

A further consideration is that for solar cells to be an economically attractive energy source, quite thin (less than ten micron) layers are desirable. The previously useful substrate roughness known to the art is, therefore, disadvantageous for the formation of continuous, pinhole free films that are less than ten microns thick by vacuum evaporation techniques. It is also an advantage to low cost manufacture that the solar cell be built up sequentially by depositing the semiconductor layers on a flexible metal foil, the foil being capable of functioning as the substrate, opaque contact, and diffuse reflector.

Another consideration is reliability, since it is known that roughened surfaces react more rapidly with corrosive ambients. Roughened surfaces are also known to accumulate moisture and soil which diminish the efficiency of solar cells and ultimately lead to failure.

SUMMARY OF INVENTION

An object of this invention is to provide an efficient low cost thin film photovoltaic cell which is smooth at its electrical junction.

A further object of this invention is to provide such a cell which permits the formation thereof by building the components on one of the electrical contacts which functions as a substrate.

A still further object of this invention is to provide an efficient low cost thin film photovoltaic cell which achieves enhanced absorption of incident solar energy without increasing the roughness of the electrical junction.

In accordance with this invention, the inner surface of one of the electrical contacts is modified by microroughening while maintaining the surface macroplanar. In this manner, the microroughening makes it possible to achieve a multiple optical pass while the macro-planar surface permits the electrical contact to function as a substrate upon which the other components of the cell may be deposited with a planar electrical junction resulting.

THE DRAWINGS

DETAILED DESCRIPTION

Figure 1:
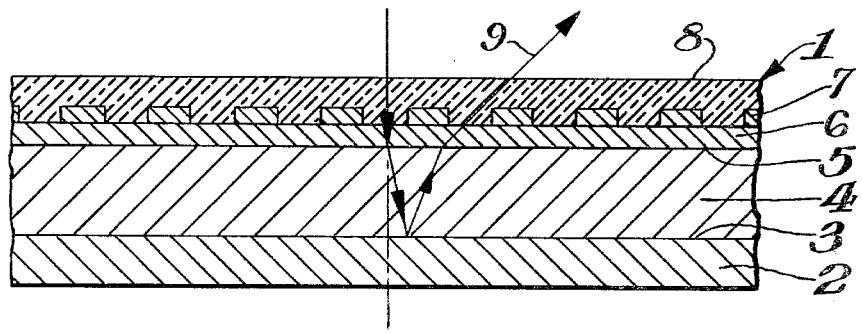
FIG. 1 is a cross-sectional elevation view of a conventional thin film photovoltaic cell illustrating only a single optical pass therein.

FIG. 1 illustrates a conventional thin film photovoltaic cell 1 which includes an opaque electrical contact 2 with a first semiconductor 4 formed thereon and a second semiconductor 6 formed on first semiconductor 4. An electrical junction 5 results between the semiconductors 4, 6. Formed on semiconductor 6 is a transparent electrical contact 7 such as in the form of a grid and an encapsulation 8 is formed thereon. Suitable techniques for the manufacture of such cell are described in co-pending commonly assigned application Ser. No. 43,315 filed May 29, 1979 which describes the continuous manufacture of thin film photovoltaic cells wherein the opaque contact serves as a substrate upon which the other components of the cell are formed. The details of that application are incorporated herein by reference thereto.

With such a conventional cell 1, the inner surface 3 of substrate or opaque contact 2 is planar. Accordingly, as indicated by the ray pattern 9, light entering the cell is reflected by surface 3 and exits out of the cell after only a single pass. As previously described, this results in low energy conversion.

Figure 2:
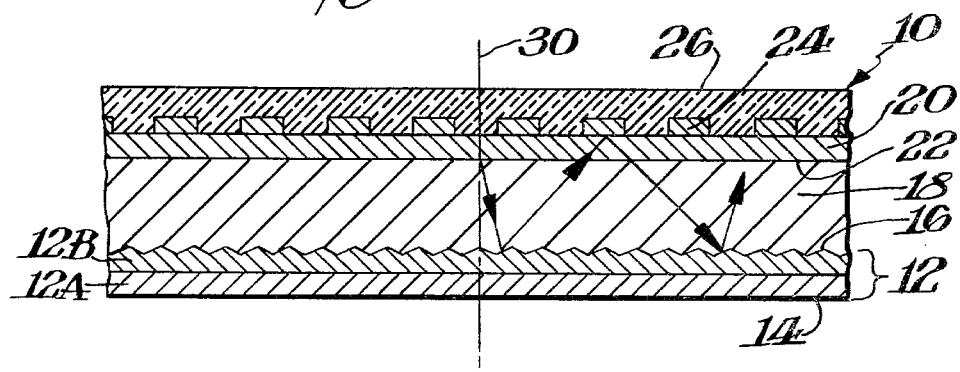
FIG. 2 is a cross-sectional elevation view, similar to FIG. 1, of a photovoltaic cell in accordance with this invention.

FIG. 2 illustrates a cell 10 in accordance with this invention. In general, cell 10 includes components similar to that described in FIG. 1. In this respect cell 10 includes an opaque electrical contact 12 which is formed, for example, by a base member 12A having a plated layer 12B thereon. Opaque contact 12 includes an outer surface 14 and an inner surface 16. A semiconductor 18 which functions, for example, as a collector-converter is formed on inner surface 16 and a second semiconductor 20 which functions as an absorber-generator is formed on collector-converter 18 with a planar electrical junction 22 therebetween. Transparent electrical contact 24 is formed on absorber-generator 20 and finally cell 10 includes encapsulation 26. Any suitable materials and techniques may be used for forming cell 10. It is preferred, however, that cell 10 be manufactured in accordance with the technology described in the aforenoted co-pending application Ser. No. 43,315, filed May 29, 1979. In accordance therewith, although not illustrated herein, blocking layers may also be provided to prevent undesired shorts.

In one practice of this invention, base layer 12A may be a copper base with an α-brass plated layer 12B thereon. When the base layer is an electro-formed foil, plated layer 12B is formed on the so-called smooth side of the foil which during electro-forming contacted the mandrel. In another practice of this invention opaque contact 12 is made entirely of brass so that layers 12A and 12B are combined. Collector-converter semiconductor 18 may be a cadmium sulfide or zinc cadmium sulfide layer. Absorber-generator semiconductor 20 may be a copper sulfide layer. Grid 24 may be of any suitable material such as a noble metal, and encapsulation layer 26 may be transparent glass.

Figure 3:
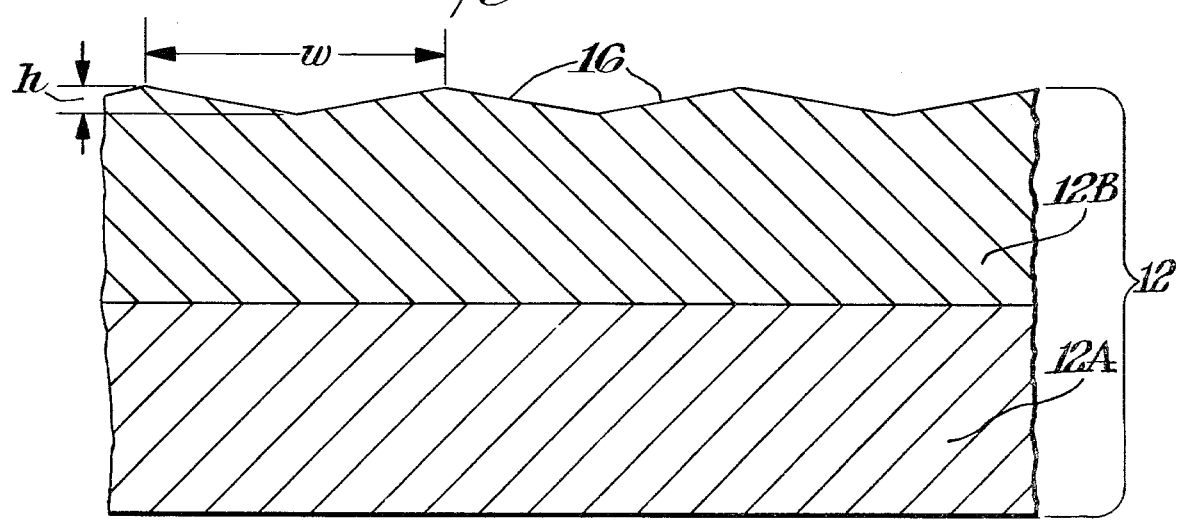
FIG. 3 is an enlarged cross-sectional elevation view of a portion of the cell of FIG. 2.

In accordance with this invention, surface 16 of opaque electrical contact or substrate 12 is modified by microroughening while being maintained macro-planar. By practice of this invention, the area of the electrical junction 22 is minimized and surfaces of subsequent layers 20, 24 and 26 remain smooth. It is noted that FIG. 2 illustrates the microroughening in an exaggerated scale to facilitate an understanding of the invention. Referring to FIG. 3, the microroughening of surface 16 of substrate 12 has the following dimensions: the average height, h, is 0.2 to 1.0 micron, preferably 0.5 micron and the peak-to-peak spacing, w, is 0.4 to 11 microns, preferably 6 microns. The reflectance of the α-brass layer exceeds 80% in the useful wavelength range of 0.6 to 1.2 microns when the zinc thickness is properly chosen in accordance with the results reported by J. A. Bragagnolo, Proceedings of the Thirteenth IEEE Photovoltaic Specialists Conference, Washington, DC, June 1979, pages 412-416. Because of the microroughening, light rays 30 entering cell 10 are reflected by surface 16 in such a manner that a large fraction of the light incident upon substrate 12 is reflected at an acute angle, insuring total internal reflection at the outer surface of absorber-generator 20, thus preventing the loss of usable photons. See FIG. 2.

In addition to achieving the advantage of high energy conversion by virtually complete absorption of the solar spectrum within the response range of cell 10, the invention also retains the advantage of being able to use opaque electrical contact 12 as a substrate so that the other components of cell 10 may be built thereon in the manner previously described with the junction 22 being planar.

In accordance with the concepts of this invention various techniques may be used for forming the microroughening of surface 16 while still maintaining it macro-planar. One technique is to mechanically or chemically roughen the surface 16 of the metal substrate 12 on the depth scale of the order of about 0.5 μm. This might be done by a mechanical abrasion or by rolling through suitably textured rolls. A number of suitable chemical etches are also known to produce a diffuse reflecting surface on copper or low-zinc brasses.

A further technique to practice the invention is to first chemically clean and polish the substrate surface 16 in a manner equivalent to the current practice of anodic cleaning the copper. The substrate material, preferably an α-brass would be in the annealed condition prior to this chemical cleaning and polishing. The substrate would then be plastically deformed by stretching or flexing in order to produce extensive plastic deformation. It is known that slip in α-brass takes place with large displacements on the slip planes creating a terraced surface. The high symmetry of the face centered cubic lattice ensures that the active slip planes will be close to the planes of maximum shear stress and hence approximately 45° to the free surface. Light incident on the substrate will be reflected so that it is incident on the Cu$_2$S outer surface at an acute angle well within the angle for total internal reflection. The scale roughening will only be of the order of 0.2-1 μm.

By ensuring light trapping at wavelengths longer than 0.5 μm, the cell design can be optimized for Cu$_2$S thickness for wavelengths shorter than 0.5 μm for which the above considerations of reflection from the substrate do not apply.

Electro-formed copper sheet with an electrolytically deposited zinc layer is the traditional substrate for CdS/Cu$_2$S cells. When successfully carried out, this technology results in an extremely low cost substrate with highly desirable optical properties with appropriate matching to the CdS semiconductor. The major problems with the technology are reliability and reproducibility arising mainly from the zinc plating step. A fundamental reason for the success of this substrate structure is the extremely high reflectivity of copper in the necessary wavelength range. As a result of heat treatments during cell manufacture, the reflecting surface is in fact a low zinc α-brass arising from inter-diffusion. The reflectivity of the low zinc brasses are very close to that of pure copper. The goals of the invention are to achieve the same optical and chemical behavior shown by the zinc/copper substrate using a homogeneous electro-formed substrate. In general, the invention could be practiced by electro-forming an appropriate α-brass directly, followed by a suitable roughening.

Although the invention has been specifically described with respect to cadmium sulfide/copper sulfide cells, it is to be understood that the concepts of this invention may be practiced with other materials for such thin film photovoltaic cells. Similarly, the invention has been particularly described with respect to a front wall cell, but the concepts thereof may also be practiced with a rear wall cell wherein, in essence, the positioning of the absorber-generator and the collector-converter is reversed. The characterizing feature of the invention is the utilization of an electrical contact as a substrate upon which the other cell components are built and both a planar electrical junction and multiple optical pass is achieved by modifying the inner surface of the substrate to provide microroughening while maintaining the surface macro-planar.

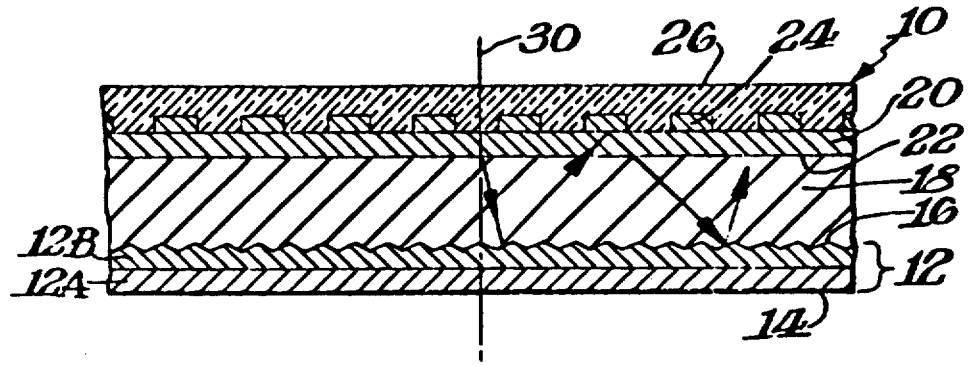

What is claimed is:

1. In a thin film photovoltaic cell having a transparent electrical contact and an opaque electrical contact with a pair of semiconductor layers less than about 10 microns thick therebetween and with the semiconductor layers functioning as an absorber and as a collector, respectively, the improvement being the electrical junction between said semiconductor layers being planar, said opaque electrical contact being in the form of a substrate having an exposed outer surface and a reflective inner surface in the interior of said cell, and said inner surface being modified by microroughening and also being macro-planar wherein said microroughening of said inner surface is to a depth of 0.2–1 micron and with a peak-to-peak spacing of about 0.4–11 microns.

2. The cell of claim 1 wherein said substrate comprises a copper base with an $\alpha$-brass layer thereon, said semiconductor layers comprises a cadmium sulfide type layer adjacent said substrate and functioning as said collector and a copper sulfide type layer functioning as said absorber remote from said substrate.

3. The cell of claim 1 wherein said substrate comprises an $\alpha$-brass layer, said semiconductor layers comprising a cadmium sulfide type layer adjacent said substrate and functioning as said collector and a copper sulfide type layer functioning as said absorber remote from said substrate.

4. The cell of claim 1 wherein said depth is about 0.5 micron and said spacing is about 6 microns.

5. The cell of claim 1 wherein the total reflectance of said reflective inner surface is greater than 80% for light in the wavelength range 0.6 to 1.2 microns.

* * * * *

UNITED STATES PATENT AND TRADEMARK OFFICE
CERTIFICATE OF CORRECTION

PATENT NO. : 4,328,390

DATED : May 4, 1982

INVENTOR(S) : John D. Meakin et al.

Page 1 of 2

It is certified that error appears in the above-identified patent and that said Letters Patent is hereby corrected as shown below:

The Title Page should appear as shown on the attached sheet.

Column 1, line 36, "interally" should read -- internally --.

Claim 2, line 3, "comprises" should read -- comprising --.

Signed and Sealed this

Seventeenth Day of August 1982

[SEAL]

Attest:

Attesting Officer

GERALD J. MOSSINGHOFF

Commissioner of Patents and Trademarks

United States Patent [19]

Meakin et al.

[11] 4,328,390

[45] May 4, 1982

[54] THIN FILM PHOTOVOLTAIC CELL

[75] Inventors: John D. Meakin; Julio Bragagnolo, both of Newark, Del.

[73] Assignee: The University of Delaware, Newark, Del.

[21] Appl. No.: 185,322

[22] Filed: Sep. 8, 1980

Related U.S. Application Data

[63] Continuation-in-part of Ser. No. 76,238, Sep. 17, 1979, abandoned.

[51] Int. Cl.³ .............................................. H01L 31/06
[52] U.S. Cl. .................................. 136/259; 136/256; 136/260; 357/30; 357/52; 357/68
[58] Field of Search ....................... 136/259, 260, 256; 357/30, 52, 68

[56] References Cited

U.S. PATENT DOCUMENTS

| 3,487,223 | 12/1969 | St. John | 250/216 |
| 4,053,326 | 10/1977 | Forrat | 136/256 |
| 4,166,880 | 9/1979 | Loferski et al. | 428/457 |

OTHER PUBLICATIONS

J. A. Bragagnolo, "Photon Loss Analysis of Thin Film CdS/Cu₂S Photovoltaic Device", *Conf. Record, 13th IEEE Photovoltaic Specialists Conf.* (1978), pp. 412-416.

*Primary Examiner*—Aaron Weisstuch
*Attorney, Agent, or Firm*—Connolly and Hutz

[57] ABSTRACT

A thin film photovoltaic cell having a transparent electrical contact and an opaque electrical contact with a pair of semiconductors therebetween includes utilizing one of the electrical contacts as a substrate and wherein the inner surface thereof is modified by microroughening while being macro-planar.

5 Claims, 3 Drawing Figures